United States Patent [19]

Jones et al.

[11] Patent Number: 4,701,917
[45] Date of Patent: Oct. 20, 1987

[54] DIAGNOSTIC CIRCUIT

[76] Inventors: Thomas M. Jones, 6050 Glen Heather, Dallas, Tex. 75252; David M. Chastain, 1208 Serenade Cir., Plano, Tex. 75075

[21] Appl. No.: 622,450

[22] Filed: Jun. 20, 1984

[51] Int. Cl.<sup>4</sup> ........................ G06F 11/00; G01R 31/28
[52] U.S. Cl. ........................................ 371/16; 371/25; 371/69
[58] Field of Search ....................... 371/25, 16, 21, 51, 371/69; 307/272 A, 455, 467; 362/183, 238; 364/782, 728, 824, 200, 900

[56] References Cited

U.S. PATENT DOCUMENTS

| | | | |
|---|---|---|---|
| 3,889,110 | 6/1975 | Hakata | 364/782 |
| 4,094,009 | 6/1978 | Schneider | 365/183 |
| 4,262,358 | 4/1981 | Marino | 371/51 |
| 4,347,580 | 8/1982 | Bond | 364/824 |
| 4,386,282 | 5/1983 | Scavuzzo | 307/272 A |
| 4,441,075 | 4/1984 | McMahon | 371/25 |
| 4,476,431 | 10/1984 | Blum | 371/25 |
| 4,498,172 | 2/1985 | Bhavsar | 371/25 |
| 4,503,537 | 3/1985 | McAnney | 371/25 |
| 4,513,418 | 4/1985 | Bardell | 371/25 |
| 4,517,672 | 5/1985 | Pfleiderer | 371/25 |
| 4,534,030 | 8/1985 | Pacz | 371/25 |

OTHER PUBLICATIONS

Frechette, T. J. & Tanner, F., *Electronics*, "Support Processor Analyzes Errors Caught by Latches", Nov. 8, 1979, pp. 116–118.

Primary Examiner—Michael R. Fleming
Attorney, Agent, or Firm—Richards, Harris, Medlock & Andrews

[57] ABSTRACT

A diagnostic circuit is used to test the operation of a complex digital system by transferring operands to and from a plurality of registers (12, 14, 16). In a typical application the registers (12, 14, 16) in operation utilize parallel data transfers. For diagnostic purposes the registers (12, 14, 16) are connected serially and, in response to selected shift commands, data can be shifted either right or left through the registers (12, 14, 16). First and second buses (18, 20) provide serial, bidirectional paths for data transfer between the group of registers (12, 14, 16) and a service processing unit (26). In response to commands generated by the service processing unit (26) the registers (12, 14, 16) can be loaded right or left and read right or left. Whenever data is being read from the registers (12, 14, 16) the output data is recirculated back into the registers such that a complete cycle results in the original state being restored in the registers (12, 14, 16).

8 Claims, 1 Drawing Figure

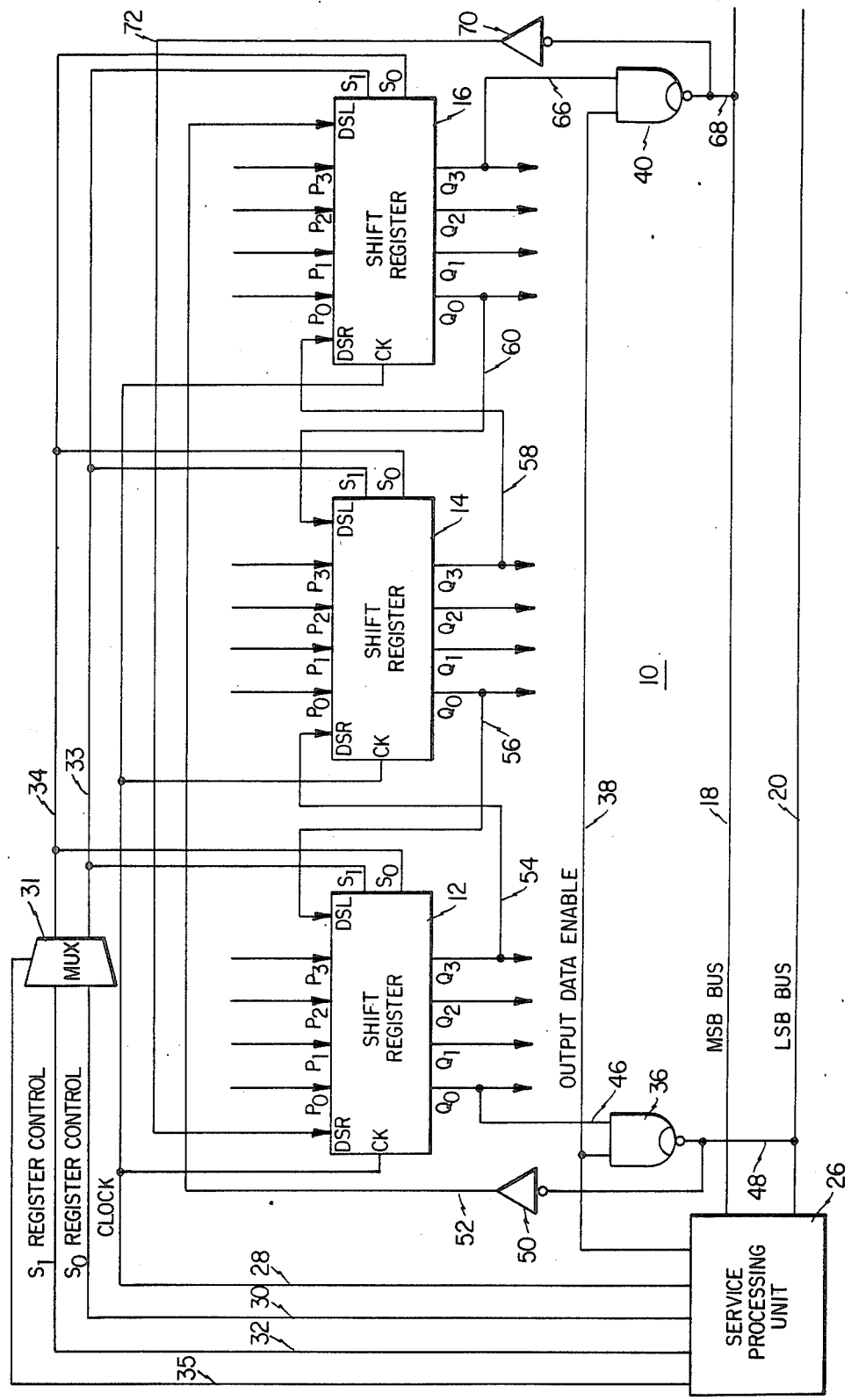

4,701,917

DIAGNOSTIC CIRCUIT

TECHNICAL FIELD

The present invention pertains in general to digital circuits and in particular to the testing of such circuits by transfer of data into and out of the circuits.

BACKGROUND ART

A complex computer system is often difficult to test to verify proper operation or to locate a failure unless it has been designed to incorporate test features. Such test features for diagnosing the operation of computer hardware can be operated automatically by a supplemental processor to make a comprehensive evaluation of the operability of the computer circuitry. By use of such automation it is possible for the testing of computer hardware to be carried out at a remote location by transmitting commands through telephone lines. For complex circuits, such as computers, it is vital to have a diagnostic circuit which provides extensive and revealing testing for the proper operation of the complex circuitry.

One technique which has been used for diagnosing circuit operation is termed a "scan ring". This technique links together a group of registers within a circuit to permit a serial path of data to be shifted into the registers. The registers can then be loaded with a selected bit pattern to test circuit operation. The use of a scan ring is described in "Electronics", Nov. 8, 1979 by Theodore J. Frechelte and Fred Tanner" entitled "Support Processor Analyzes Errors Caught by Latcher". Although a scan ring can provide substantial information, it is limited in its application since there are numerous types of failures which can produce spurious failure indications or completely block the operation of the scan ring so that no useful information can be produced.

In view of the necessity for diagnosing digital circuits, there exists a need for a diagnostic circuit to transfer data into and out of digital circuits so that comprehensive and thorough tests can be run on the circuits.

SUMMARY OF THE INVENTION

A selected embodiment of the present invention comprises a diagnostic circuit for exchanging test data patterns with a plurality of registers within a digital circuit. The diagnostic circuit includes first and second bidirectional, serial buses. The plurality of registers to be tested are connected in series to shift data therethrough for both left and right shifts wherein the registers are connected together in a group to have at least a first register and a last register. Circuitry is provided which is responsive to a first enable command for serially transferring data stored in the plurality of registers from the first register to the first bus for transmission therethrough. The data from the registers is further provided as an input to the last of the registers for recirculating the data back into the registers. The circuitry is responsive to a second enable command for transferring data from the first bus into the registers. Further circuitry is provided which is responsive to the first enable signal for serially transferring data stored in the plurality of registers from the last register to the second bus for transmission therethrough and also to an input of the first register for recirculating the data back into the registers. The circuitry is further responsive to the second enable command for transferring data from the second bus into the registers.

DETAILED DESCRIPTION OF THE DRAWING

For a more complete understanding of the present invention and the advantages thereof, reference is now made to the following description taken in conjunction with the accompanying Drawing which is a schematic illustration of a circuit that employs the diagnostic circuit of the present invention to provide flexible and comprehensive testing for a digital circuit.

DETAILED DESCRIPTION OF THE INVENTION

The present invention comprises a diagnostic circuit principally directed to the testing of registers in a complex digital circuit, such as a computer. Such diagnostic circuits are highly useful to confirm that a computer is functioning properly, as well as to aid in the location of a failed unit within the computer.

Referring now to the FIGURE, the overall circuit which includes the diagnostic circuit of the present invention is referenced by the numeral 10. Shift registers are very commonly used circuits within digital systems. The circuit 10 includes three identical shift registers 12, 14 and 16. A representative shift register of this type is a model F194 manufactured by Fairchild Semiconductor, Inc. Each of the registers 12, 14 and 16 is a 4 bit register having four parallel input terminals ($P_0$, $P_1$, $P_2$ and $P_3$), four parallel output terminals ($Q_0$, $Q_1$, $Q_2$ and $Q_3$), a right shift serial input (DSR), a left shift serial input (DSL) and a clock input (CK). Each of the registers 12, 14 and 16 further has two control inputs labeled $S_0$ and $S_1$.

The circuit 10 includes a most significant bit (MSB) bus 18 and a least significant bit (LSB) bus 20. The buses 18 and 20 transmit data serially and both are bidirectional.

The buses 18 and 20 are connected to a service processing unit 26 which serves to transmit and receive data through the buses 18 and 20, as well as to produce a clock signal and various control signals for the circuit 10. The unit 26 is described in copending application entitled Vector Processing Computer Ser. No. 622,460 filed June 20, 1984 and assigned to the assignee of the present application. The service processing unit 26 produces a clock signal which is transmitted through a line 28 to the clock inputs of registers 12, 14 and 16. The unit 26 produces an $S_0$ register control signal which is transmitted through a line 30 to a multiplexer 31. From multiplexer 31 the $S_0$ control signal is sent through line 33 to the $S_0$ inputs of the registers 12, 14 and 16. The unit 26 produces an $S_1$ register control signal which is transmitted through a line 32 to the multiplexer 31 and from multiplexer 31 through a line 34 to the $S_1$ inputs of the registers 12, 14 and 16. The service processing unit 26 produces a mode select command for normal or parallel control of registers 12, 14 and 16. The mode select command is transmitted through a line 35 to the control input of multiplexer 31. The unit 26 further produces an OUTPUT DATA ENABLE signal which is transmitted through a line 38 to the first input of a NAND gate 36 and to the first input of a NAND gate 40.

The $Q_0$ output of the register 12 is connected through a line 46 to the second input of the NAND gate 36. The output of the NAND gate 36 is transmitted through a line 48 to both the bus 20 and the input of an inverter 50. The output of the inverter 50 is transmitted through a line 52 to the DSL input of register 16. The $Q_3$ output of register 12 is connected through a line 54 to the DSR input of the next succeeding register 14.

The $Q_0$ output of register 14 is connected through a line 56 to the DSL input of preceding register 12. The $Q_3$ output of register 14 is connected through a line 58 to the DSR input of register 16.

The $Q_0$ output of register 16 is connected through a line 60 to the DSL input of register 14. The $Q_3$ output of register 16 is transmitted through a line 66 to the second input of the NAND gate 40. The output of gate 40 is transmitted through a line 68 to the bus 18 and to the input of an inverter 70. The output of inverter 70 is transmitted through a line 72 to the DSR input of register 12.

The operation of the diagnostic circuit of the present invention is now described in reference to the FIGURE. The registers 12, 14 and 16 perform conventional functions in a digital circuit. In such a circuit the primary mode of operation is a parallel load and parallel output of data. These registers also include serial inputs for use in the diagnostic circuit of the present invention. In a typical application all of the registers on a single card are connected together serially as shown in the FIGURE so that a serial string of data can be shifted through the registers.

For the present example it is assumed that the registers are connected so that the first register is 12, the intermediate register is 14 and the last register is 16. This, however, is arbitrary and an equally valid example would be the reverse. The registers 12, 14 and 16 are connected so that data can be shifted through the group of registers in either a right shift or a left shift. For example, a data stream input through the DSL input of register 16 is output at terminal $Q_0$ and transmitted through line 60 to the DSL input of the register 14.

Likewise, the data is output at the $Q_0$ output of register 14 and transmitted through line 56 to the DSL input of register 16 where it is then output through the $Q_0$ output thereof. Right shift data is transmitted through the DSR terminal of register 12 and output through the $Q_3$ terminal thereof to line 54 which provides the data to the DSR input of register 14. This data is output from the $Q_3$ terminal of register 14 through line 58 to the DSR input of register 16. The serial data is then output at the $Q_3$ terminal of register 16. Thus, it can be seen that data can be shifted in either direction through the plurality of serially connected registers 12, 14 and 16.

The control of the registers 12, 14 and 16 for diagnostic purposes is carried out by unit 26 selecting a diagnostic mode for multiplexer 31 by applying binary states to the lines 30 and 32 for inputting commands to the $S_0$ and $S_1$ terminals of the registers. For the terminals $S_0$ and $S_1$ the commands are, for example, 01-shift left, 10-shift right, 11-parallel load and 00-hold, do nothing. By means of these commands the service processing unit 26 directs the diagnostic and normal functioning of the circuit 10. First and second enable commands are transmitted through a line 38 corresponding to the two states of the OUTPUT DATA ENABLE signal.

The service processing unit 26 can control clocks applied to each of the circuits 10 in a system so that only one circuit is scanned at a time.

The service processing unit 26 can read the bit pattern in the registers 12, 14 and 16 in two ways which are through buses 18 and 20 respectively. When the enable line 38 is set to a logic "1" state and a shift left command is applied at lines 30 and 32, the data in the registers 12, 14 and 16 is transferred in the direction from register 16 to 14 to 12. The resulting data is clocked into the NAND gate 36 where it is inverted and transmitted to line 48 and thus to bus 20 where it is input to the service processing unit 26. The output of gate 36 is likewise transmitted through inverter 50 to produce a true state of the data and this resulting true data is transmitted through line 52 to the DSL input of the register 16. Thus, as the data is clocked from the registers 12, 14 and 16 onto the bus 20, it is also recirculated back into the registers so that after one complete cycle the contents have been unloaded from the registers but have also been restored to the registers in the original condition. When the NAND gates 36 and 40 have the enable input at a logic "0", the gate produces an open collector, high impedance, state at the output.

The other technique for reading the contents of the registers 12, 14 and 16 is a right shift transferring the data in the order of register 12, 14 and 16. This condition is set up with a shift right command on the $S_0$ and $S_1$ terminals at lines 30 and 32 together with driving enable line 38 to a logic "0" state. Under these conditions the data within the registers is passed through the NAND gate 40 to line 68 where it is passed serially to bus 18 for input to the service processing unit 26. At the same time the data from the NAND gate 40 is passed through the inverter 70 to reproduce the true data state and the resulting data is provided through line 72 to the DSR input of register 12. In this manner the output data is recirculated through the registers 12, 14 and 16 to re-establish the original data state when one full cycle is completed.

A selected data string can be loaded into the registers 12, 14 and 16 in two ways from the service processing unit 26. If a shift left command is generated at lines 30 and 32 and the enable signal at line 38 is driven to a logic "0" state, the selected data string is shifted from the service processing unit 26 through bus 20, through line 48 and inverter 50 into the DSL input of register 16. The data is then loaded sequentially through registers 16, 14 and 12. In a second method a right shift command is entered through the $S_0$ and $S_1$ terminals connected to lines 30 and 32 and a logic "0" state is applied to the enable line 38. The selected data stream is transmitted from the service processing unit 26 through bus 18, line 68, inverter 70 and line 72 to the DSR input of register 12. The data is sequentially shifted through the registers 12, 14 and 16.

The configuration of the present invention, which includes the two buses 18 and 20, has a number of distinct advantages in diagnosing and detecting failures within the circuit 10. First, if only a single bus were used then it would not be possible to carry out the diagnostics if the bus itself were stuck, that is, locked to one logic level. By using two buses it is possible to detect that a bus itself has become stuck rather than a failure in the shift registers and associated circuitry. Second it is possible to determine the location of a stuck bit within the group of shift registers. This is done by loading a given data state into the registers to the extent permitted by the failure and then reading out in the opposite direction and counting each clock until a transition is detected in logic states. This count can then be used to isolate a failure to a particular chip.

In summary, the present invention comprises a diagnostic circuit which can read data from and write data to a plurality of registers in either a right or left shift. While reading, the data is recirculated back into the registers to restore the initial state. The use of two buses and independent right and left shift commands permits the group of registers to be written into or read with either a right or left shift.

Although one embodiment of the invention has been illustrated in the accompanying Drawings and described in the foregoing Detailed Description, it will be understood that the invention is not limited to the embodiment disclosed, but is capable of numerous rearrangements, modifications and substitutions of parts and elements without departing from the scope of the invention.

We claim:

1. A diagnostic circuit for exchanging test data with a plurality of registers, comprising:

first and second bidirectional, serial buses;

said plurality of registers connected in series to shift data therethrough for both left and right shifts, said registers connected together in a group to have a first register and a last register;

first means connected to said first bus, said first register and said last register, said first means operative in resopnse to an externally supplied first enable command for serially transferring data held in said registers from said first register to said first bus for transmission therethrough and to an input of said last register for recirculating the data back into said registers, and said first means operative in response to an externally supplied second enable command for serially transferring data from said first bus through one of said registers for placing data into said registers; and second means connected to said first bus, said first register and said last register, said second means operative in response to said first enable command for serially transferring data held in said registers from said last register to said second bus for transmission therethrough and to an input of said first register for recirculating the data back into said registers, and said first means operative in response to said second enable command for serially transferring data from said second bus into said registers; wherein the data transferred between saids buses and said registers reflects the functional state of said registers.

2. A diagnostic circuit as recited in claim 1 where in said first means is connected to transfer data from said first bus into said registers by input to said last register and said second means is connected to transfer data from said second bus into said registers by input through said first register.

3. A diagnostic circuit as recited in claim 1 wherein said first means comprises:

a NAND gate having a first input connected to a first output terminal of said first register, a second input connected to receive said first enable command and the output thereof connected to said first bus, and an inverter having the input thereof connected to the output of said NAND gate and the output thereof connected to an input terminal of said last register.

4. A diagnostic circuit as recited in claim 1 wherein said second means comprises:

a NAND gate having a first input connected to a first output terminal of said last register, a second input connected to receive said second enable command and the output thereof connected to said second bus, and an inverter having the input thereof connected to the output of said NAND gate and the output thereof connected to an input terminal of said first register.

5. A diagnostic circuit for exchanging test data with a plurality of registers, comprising:

first and second bidirectional serial buses, each of said registers having a right shift serial input, a left shift serial input, and a plurality of parallel output terminals, which include first and second serial output terminals, said registers serially connected to include a first register, a last register, and at least one intermediate register, wherein each intermediate register has the first output terminal thereof connected to the right shift serial input of a first one of said registers connected thereto and the second output terminal thereof connected to the left shift serial input of a second one of said registers connected thereto, first means connected to said first bus, the second output of said first register and to the left shift serial input of said last register, said first means operative in response to a first enable command, following receipt of a first shift command by said registers, for transferring data from the second output terminal of said first register to said first bus wherein the data transferred from said registers reflects the functional status of said registers; and said first means operative in response to a second enable command, following receipt of said first shift comand by said registers, for transferring data from said first bus to the left shift serial input of said last register top apply test data for evaluating said registers, wherein said first register has the first output terminal thereof connected to the right shift serial input of the one of said registers connected thereto and second means connected to said second bus, the first output terminal of said last register and the right shift serial input of said first register, said second means operative in response to said first enable command, following receipt of a second shift command by said registers, for transferring data from the first output terminal of said last register to said second bus wherein the data transferred from said registers reflects the functional status of said registers; and said second means operative in response to said second enable command for transferring data from said second bus to the right shift serial input of said first register to apply test data for evaluating said registers, wherein said last register has the second output terminal thereof connected to the left shift serial input of the one of said registers connected thereto.

6. A diagnostic test circuit as recited in claim 5 wherein said first means comprises:

a NAND gate having a first input connected to receive said enable commands and a second input connected to the second output of the first register and having the output thereof connected to said first bus, and an inverter having the input thereof connected to the output of said NAND gate and the output thereof connected to the left shift serial input of said last register wherein the data stored in said plurality of registers can be transferred to said first bus and concurrently recirculated back into said plurality of registers.

7. A diagnostic test circuit as recited in claim 5 wherein said second means comprises:
- a NAND gate having a first input connected to receive said enable commands and a second input connected to the first output of said last register and having the output thereof connected to said second bus, and
- an inverter having the input thereof connected to the output of said NAND gate and the output thereof connected to the right shift serial input of said first register wherein the data stored in said plurality of registers can be transferred to said first bus and concurrently recirculated back into said plurality of registers.

8. The method for testing a plurality of serially connected registers, comprising the steps of:
- transmitting a predetermined data pattern serially through a first bus
- transferring said data pattern from said first bus into a first of said registers for serial and sequential transfer into said registers in a first direction,
- shifting said data pattern serially out of said registers in a second direction and transferring said data pattern serially to a second serial bus for transfer therethrough,
- comparing the data pattern shifted from said registers to the data pattern input to said registers for detecting a break in the comparison, and
- counting the bits of said data pattern shifted from said registers until said break is detected wherein said count indicates the identity of a failed one of said registers.

* * * * *

UNITED STATES PATENT AND TRADEMARK OFFICE
CERTIFICATE OF CORRECTION

PATENT NO. : 4,701,917
DATED : Oct. 20, 1987
INVENTOR(S) : Jones et al

It is certified that error appears in the above-identified patent and that said Letters Patent is hereby corrected as shown below:

Column 5, line 43, delete "saids" and substitute --said--.

Column 5, line 46, delete "where in" and substitute --wherein--.

Column 6, line 33, delete "top" and substitute --to--.

Signed and Sealed this

Tenth Day of May, 1988

Attest:

DONALD J. QUIGG

Attesting Officer

Commissioner of Patents and Trademarks